US007444266B2

(12) United States Patent
Stenestam et al.

(10) Patent No.: US 7,444,266 B2
(45) Date of Patent: Oct. 28, 2008

(54) CONTROL SYSTEM FOR A TRANSFORMER OR REACTOR

(75) Inventors: Bengt-Olof Stenestam, Ludvika (SE); Gunnar Andersson, Nyhammar (SE)

(73) Assignee: ABB Technology Ltd. (CH)

( * ) Notice: Subject to any disclaimer, the term of this patent is extended or adjusted under 35 U.S.C. 154(b) by 80 days.

(21) Appl. No.: 11/385,434

(22) Filed: Mar. 21, 2006

(65) Prior Publication Data

US 2007/0225945 A1 Sep. 27, 2007

(51) Int. Cl.
*G06F 11/30* (2006.01)
*G06F 15/00* (2006.01)
*G21C 17/00* (2006.01)

(52) U.S. Cl. ........................ 702/185; 336/150; 702/130

(58) Field of Classification Search .................. 702/64, 702/99, 130, 185; 361/35, 37, 38, 130, 191; 200/11 TC; 336/150; 340/646, 657
See application file for complete search history.

(56) References Cited

U.S. PATENT DOCUMENTS 2,968,737 A * 1/1961 Cosar .......................... 307/51
4,937,703 A * 6/1990 Adams ....................... 361/187
5,550,460 A 8/1996 Bellin et al. ................ 323/255
5,815,385 A * 9/1998 Hyttinen et al. ............... 363/34
5,901,070 A 5/1999 Trainor .................. 364/528.33
6,124,726 A * 9/2000 Dohnal et al. ............... 324/772
6,218,643 B1 * 4/2001 Iwata et al. ................. 219/202
6,518,771 B2 * 2/2003 Frotscher et al. ............ 324/547
6,906,630 B2 * 6/2005 Georges et al. ............. 340/646
6,965,217 B2 * 11/2005 Dohnal et al. ............... 323/257
7,089,145 B2 * 8/2006 Stenestam et al. ........... 702/130
7,145,760 B2 * 12/2006 Stenestam et al. ........... 361/115
2006/0292710 A1 * 12/2006 Golner et al. ................. 438/14

FOREIGN PATENT DOCUMENTS

WO WO 02/054562 7/2002

OTHER PUBLICATIONS

Sanders et al., 'Technical Diagnostics for Power Appratus', Jun. 2001, IEEE Publication, No. 482, pp. 1-5.*
Fedirchuk et al., 'Managing Trasformer Overload-Smart Relays', 2000, IEEE Publication, pp. 25-28.*
International Search Report, Jul. 27, 2007, 5 pages.

* cited by examiner

*Primary Examiner*—Edward Raymond
*Assistant Examiner*—Elias Desta
(74) *Attorney, Agent, or Firm*—St. Onge Steward Johnston & Reens LLC

(57) ABSTRACT

A universal control and diagnostic system for a transformer that may be retrofit with existing control and tap-changer equipment, the system providing for remote monitoring and control of the equipment and for measuring various criteria associated with the tap-changer to substantially minimize damage to the equipment during a maneuver and for substantially avoiding carbonization of a connected contact.

10 Claims, 6 Drawing Sheets

Determine a Threshold Valve Representative of The Total Time a Contact May be Closed — 202
Measure the Total Time the Contact Has Been Closed — 204
Measure the Temp. in The Tap Changer — 206
Measure the Current Passing Through The Tap Changer — 208
Generate a Closed Time Value Based on the Measured Time, Temp. and Current — 210
Does The Closed Time Value Exceed the Threshold Value? — 212 (No → 204; Yes → 214)
Generate Warning Meassage — 214

User Input Criteria
78
16
68
Power Interruption Signal
62
Contact Alarm Signal
56
Temp. Alarm Signal
50
Contact Closure
48
Current
46
Voltage
44
Temp.
70
Alarm Signals
72
Data Signals
74
First Temp. Threshold
76
Second Temp. Threshold
84
Tap-Changer Control Signal
32a

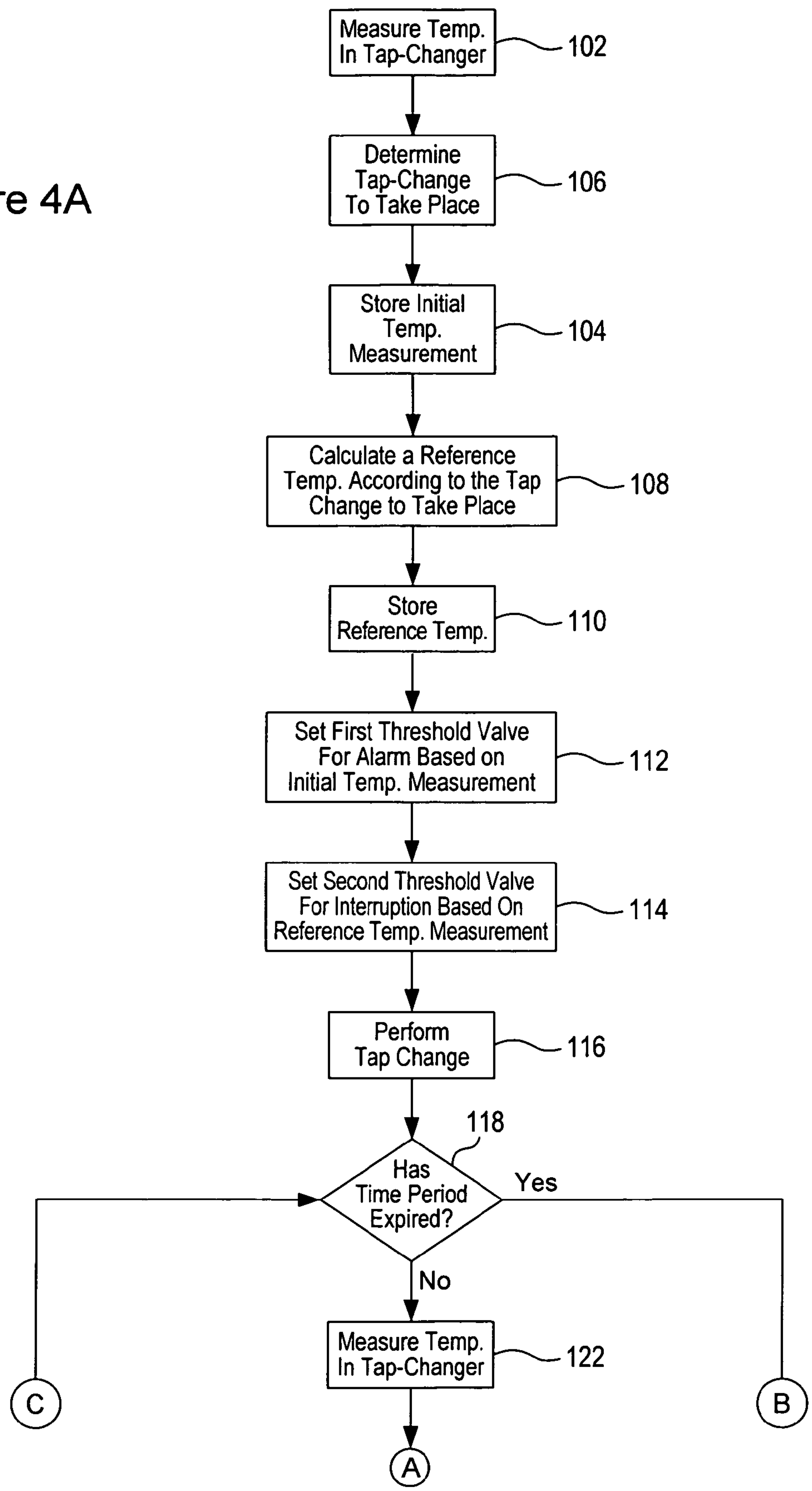
Figure 4A
Measure Temp. In Tap-Changer
102
Determine Tap-Change To Take Place
106
Store Initial Temp. Measurement
104
Calculate a Reference Temp. According to the Tap Change to Take Place
108
Store Reference Temp.
110
Set First Threshold Valve For Alarm Based on Initial Temp. Measurement
112
Set Second Threshold Valve For Interruption Based On Reference Temp. Measurement
114
Perform Tap Change
116
118
Has Time Period Expired?
Yes
No
Measure Temp. In Tap-Changer
122
C
B
A

CONTROL SYSTEM FOR A TRANSFORMER OR REACTOR

FIELD OF THE INVENTION

The present invention relates generally to a control system for a transformer or reactor and means for carrying out diagnostics of a tap-changer and methods for carrying out such diagnostics.

BACKGROUND OF THE INVENTION

Control systems for monitoring and changing of tap settings on transformers have been utilized with varying levels of success and efficiency. Historically, control systems did not provide for the sophisticated levels of control and monitoring that are highly desirable by means of network connections.

There are relatively large numbers of control cabinets and installations where the control system, while electronic in nature, is not compatible with current networking and communications technology. It is desirable to convert many of the existing control system over to a format that may easily be controlled and monitored remotely over, for example, a network. However, a problem involved with this conversion is that the costs involved with removing the control system and cabinet of the existing system and fully replacing it with an updated electronic system are correspondingly high, both in terms of materials and labor.

For example, control systems for changing of tap settings of a transformer comprise a relatively large amount of input and output signals, both for electronic control and electronic monitoring. These signals however, are generated having a particular format, voltage level, current, etc. To replace the equipment so that a desired signal format can be generated is impractical and extremely costly.

It is also critical that during operation of the tap-changer, that the operation of the tap-changer be monitored so that catastrophic failure is avoided. In relatively large commercial applications, the heat build up that may occur in a tap-changer due to, for example, incomplete switch over or change of a tap setting, can quickly lead to a catastrophic failure of the transformer. This could present a danger to individuals as well as be quite costly both in terms of replacement cost for the transformer and associated equipment, and downtime for customers.

Therefore, an effective monitoring system is critical to the safe functioning of these systems. However, the monitoring systems of many current tap-changers do not lend themselves well to being integrated with a networked control system. The numerous formats of the control and monitoring signals in existing installations further compound the challenge.

Still another challenge facing tap-changing systems is that, even during normal use of the transformer, the various contacts in the tap-changer will wear over time as current is switched by the tap-changer. For example, over time, the contacts for the tap-changer can carbonize, or develop carbon deposits on the surface of the contacts. This is highly disadvantageous because carbon deposits tend to insulate or increase the resistance to the flow of current. With the relatively high voltages typically used for commercial applications, heating and also arcing will occur at these higher resistance locations. The arcing in turn generates very high heat depositing still more carbon on the surface of the contact. If ignored, overheating and arcing due to the poor contact can lead to catastrophic failure of the device may occur.

Accordingly, what is desired is a control system that has the versatility to be integrated and/or retrofitted with existing control signal formats and simultaneously may be integrated with a networked control and monitoring system.

It is further desired to provide a networked control system and method that may effectively be used with existing tap-changing systems to monitor the changing of tap settings and for entering an alarm condition when preset limits are exceeded.

It is still further desired to provide a networked diagnostic control system and method that may be integrated with existing tap-changing system that will substantially minimum or even prevent carbonization of the tap-changer.

SUMMARY OF THE INVENTION

These and other objects are achieved in one advantageous embodiment by the provision of a networked electronic control system that may be fully integrated with an existing transformer/reactor into an existing control cabinet.

An integrated electronic control and monitoring system according to a first advantageous embodiment of the invention, may comprise an electronic board rack including, a main processor board and various peripheral boards. It is contemplated that the boards may be configured to handle both analog and digital input/output signals of various types and formats so that these may be directly coupled to the electronic control system. This provides the advantage that it is possible to combine and exchange boards of all types in the rack. Further each signal may be configured individually at any channel on each board.

Various control and/or monitoring signals are sent and received, via, for example, an interface converter from TCP/IP over serial communication to Ethernet working in both directions. In this manner, it is possible, for example, to make all cooling control configurations from remote locations. Start/Stop temperatures for each cooler group may further be set individually. Still further, groups can be included and/or excluded from the more advanced cooling control, while temperatures settings for advanced cooling control can be adjusted.

For monitoring purposes, data collecting from electronic control systems may be accomplished by an OPC (Object-linking and embedding for Process Control) server. Additionally, an alarm and trip limits for protection sensor can be remotely set on an individual basis.

The networked system, further allows for support for sensors that communicates via CAN (Control Area Network) bus, e.g. Hydran, where the CAN sensors may be configured directly in the electronic control system. When voltage measurement is connected to the transformer electronic control system, it is possible to regulate voltage with LTC via bus communication.

Also provided is a system and method that may be integrated with existing equipment, for monitoring and notifying a user of a malfunction after, for example, a tap-changer operation.

During a tap-changer operation, when the tap-changer is switching from one set of contacts to another, there typically will be arcs and current by-passes through resistors. If the change-over is not completed, additional arcing and current through the resistors can occur. This may cause a sudden spiking of the temperature in the equipment cabinet that, for example, an installed monitoring system may not be able to draw a conclusion on rapidly enough to prevent damage to the equipment. Accordingly, the installed control system may, in another advantageous embodiment, send out an alarm and may even trip the transformer if preset threshold values are exceeded.

To accomplish this, a first temperature measurement is obtained and stored that comprises an actual temperature measured in the tap-changer at the time for the switching operation. A second calculated temperature taking into consideration various criteria related to the tap-changing operation is further obtained and stored. These two temperatures will be used as references for additional temperature measurements taken for a period of time in the tap-changer after the switching operation. It is advantageous to measure temperature in the tap-changer up to, for example, five minutes after the switching operation.

It is advantageous to use the second calculated temperature to compensate for multiple operations of the tap-changer, which may generate additional heating. If however, the temperature increase in the tap-changer exceeds preset increase values, the system may alarm at a first lower threshold level, and may further trip at a second higher threshold level.

Further, a system and method are provided that may be integrated with existing equipment, for monitoring transformer/reactor operation and tap-changer operation to substantially prevent tap-changer carbonization. For example, if a tap-changer is placed on one contact for an extended period of time, the possibility of contact carbonization substantially increases. Once carbonization begins, the contacts are being damaged, therefore, one object for the diagnostic method is to substantially avoid carbonization.

Accordingly, it is contemplated that a contact should only be maintained in a particular position for a recommended connection time to avoid development of carbonization. Therefore, the amount of time that a particular contact has been in one position is measured and compared to the recommended connection time. When the measured time in one position has reached the recommended connection time, a warning system will communicate to the customer that it is time for exercising the tap-changer.

It is further contemplated that the recommended connection time may be variously calculated. For example, the measured temperature in the tap-changer will influence the recommended connection time as will the measured current passing through the contact. It is contemplated that the higher the temperature and the higher the current, the shorted the recommended connection time will become. Alternatively, the lower the measured temperature and the lower the measured current, the longer the recommended connection time will become.

It should be noted that the recommended connection time may be different, for example, in the fine and course selectors. It is still further contemplated that it may be desirable to take into consideration the previous contact position and/or positions of the contact in determining a recommendation for exercising the tap-changer.

It is important that the system knows particular tap-changer design as movement of contacts is dependent on that. For some tap-changer types, a change in the tap-changer position is not enough to move a fine contact from one position to another; sometimes two operations in the same direction are needed. To move the course (change-over) selector, sometimes a large amount of operations in one direction is needed.

For this application the following terms and definitions shall apply:

The term "data" as used herein means any indicia, signals, marks, symbols, domains, symbol sets, representations, and any other physical form or forms representing information, whether permanent or temporary, whether visible, audible, acoustic, electric, magnetic, electromagnetic or otherwise manifested. The term "data" as used to represent predetermined information in one physical form shall be deemed to encompass any and all representations of the same predetermined information in a different physical form or forms.

The term "network" as used herein includes both networks and internetworks of all kinds, including the Internet, and is not limited to any particular network or inter-network.

The terms "first" and "second" are used to distinguish one element, set, data, object or thing from another, and are not used to designate relative position or arrangement in time.

The terms "coupled", "coupled to", and "coupled with" as used herein each mean a relationship between or among two or more devices, apparatus, files, programs, media, components, networks, systems, subsystems, and/or means, constituting any one or more of (a) a connection, whether direct or through one or more other devices, apparatus, files, programs, media, components, networks, systems, subsystems, or means, (b) a communications relationship, whether direct or through one or more other devices, apparatus, files, programs, media, components, networks, systems, subsystems, or means, and/or (c) a functional relationship in which the operation of any one or more devices, apparatus, files, programs, media, components, networks, systems, subsystems, or means depends, in whole or in part, on the operation of any one or more others thereof.

In one advantageous embodiment, a universal control system for a tap-changer for retrofit or new tap-changer equipment is provided, the control system comprising, an electronic board rack for receiving various electronic boards, and a plurality of boards positioned in the electronic board rack, the plurality of boards selected to variously send and/or receive analog and/or digital signals to and from the existing tap-changer equipment. The system is provided such that the plurality of boards each has at least one channel, and the analog and digital input and output signals directly couple to the control system via a network connection by means of the plurality of boards. The system is further provided such that the analog and digital input and output signals are individually configurable on each channel on each board.

In another advantageous embodiment, a diagnostic system for protecting a tap-changer is provided comprising, a sensor positioned to detect temperature changes, and an initial measured temperature, indicating an initial temperature measured by the sensor prior to initiating a tap change. The system further comprises a calculated temperature value, calculated according to the particular tap change to take place, and a threshold value determined based on the initial measured temperature and the calculated temperature value, at which an alarm is generated. They system still further comprises a second measured temperature indicating an actual temperature measured by the sensor after a tap change has been initiated. The system is provided such that the alarm is generated by the diagnostic system if the second measured temperature exceeds the threshold value.

In still another advantageous embodiment, a diagnostic system for preventing degradation to electrical contacts in a tap-changer is provided comprising, a contact measurement device for measuring a contact position, and a contact signal generated by the contact measurement device, indicative of whether the contact is open or closed. The system further comprises a threshold time value related to a maximum amount of time that the contact may be closed, and a controller for receiving the contact signal and generating a closed time value based on the contact signal. The system is provided such that the controller compares the closed time value to the threshold time value to determine if the closed time value exceeds the threshold time value. The system still further comprises a warning message generated by the diagnostic system indicating that the threshold time value has been exceeded.

Other objects of the invention and its particular features and advantages will become more apparent from consideration of the following drawings and accompanying detailed description.

BRIEF DESCRIPTION OF THE DRAWINGS

FIG. 4A is a flow diagram of one advantageous embodiment of the present invention according to FIG. 1.

DETAILED DESCRIPTION OF THE INVENTION

Figure 1:
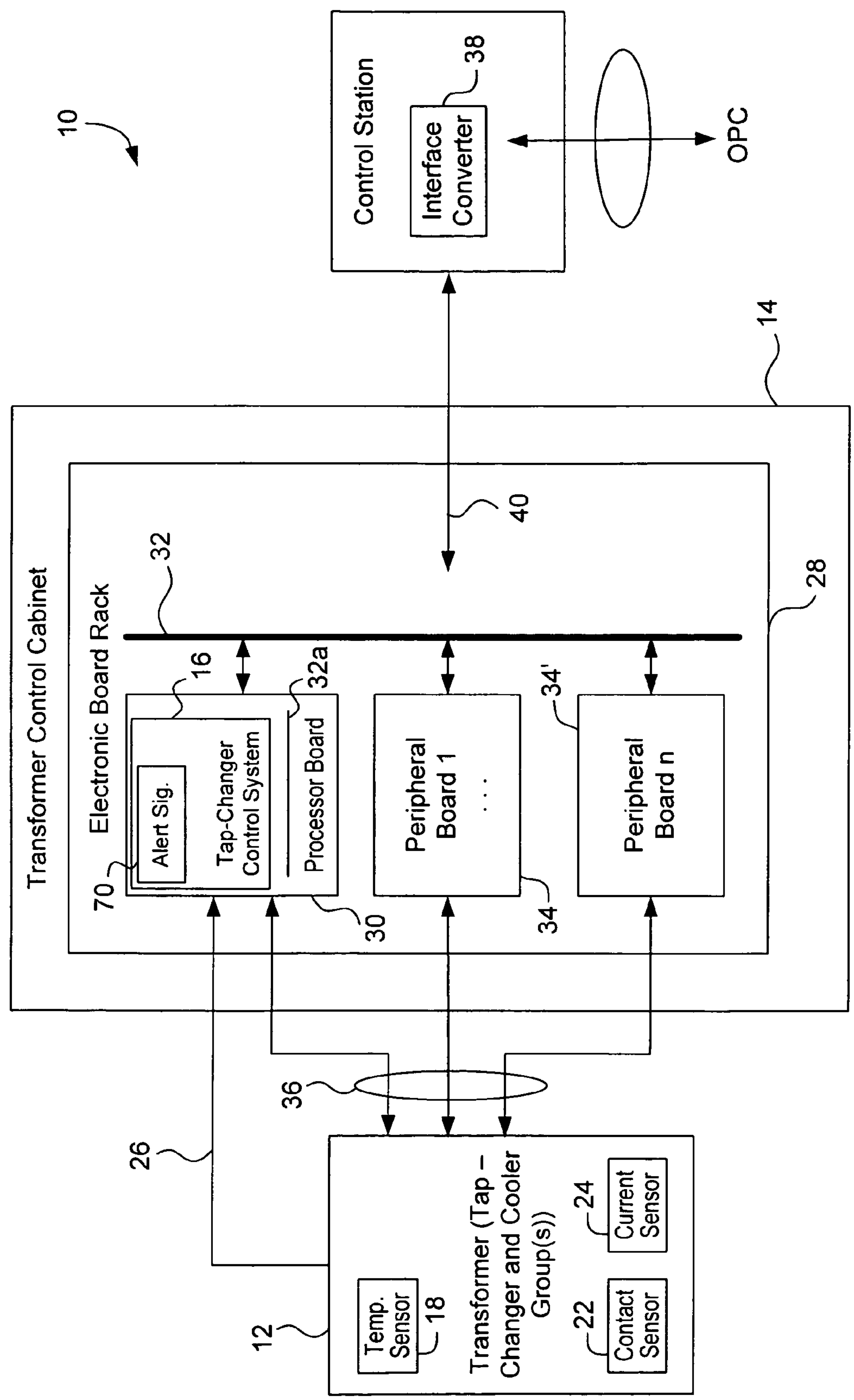
FIG. 1 is a block diagram of one advantageous embodiment of the present invention.

Referring now to the drawings, wherein like reference numerals designate corresponding structure throughout the views.

FIG. 1 illustrates one advantageous embodiment of universal control system 10 and generally comprises transformer (tap-changer and cooling group(s)) 12, transformer cabinet 14 and tap-changer control system 16.

Transformer (tap-changer and cooling group(s)) 12 is, in one advantageous embodiment, provided with temperature sensors 18, which are provided to sense the temperature in the vicinity of the tap-changer and transformer top oil and transformer bottom oil temperatures. Temperature sensors 18 may comprise virtually any type of commercially-available temperature sensors.

Transformer (tap-changer and cooling group(s)) 12 may also be variously provided with contact sensor 22 for measuring the total time a contact (not shown) has been closed, and with a current sensor 24 to measure the amount of current passing through the contact.

In one embodiment, the signals generated by the various sensors (i.e. temperature sensor 18, contact sensor 22 and current sensor 24) may be transmitted via a coupling 26 to processor board 30 positioned on electronic board rack 28 located inside cabinet 14. It is contemplated that the various sensors may communicate with universal control system 10 via, for example, a Control Area Network bus.

Processor board 30 is coupled to electronic board rack 28 by means of a bus 32, onto which, processor board 30 may be attached. Also depicted in FIG. 1 are peripheral board 1 (34) through peripheral board n (34'), which indicates that virtually any number of various peripheral boards (34, 34') may be attached to bus 32 and are selected based on the particular application. Processor board 30 and peripheral boards (34, 34') variously communicate with the transformer (tap-changer and cooling group(s)) 12 via a coupling 36.

It is contemplated that a relatively wide variety of peripheral boards (34, 34') may be made available to communicate with existing tap-changers and/or existing cooling group(s). The signals may comprise, for example but are not limited to, sent and/or received analog and/or digital signals in a wide variety of signal formats. This versatility is advantageous because the wide variety peripheral boards (34, 34') may be selected from to interface with existing equipment each having particular signal formatting and structure.

An interface converter 38 is further positioned in the station control room. Interface converter 38 is provided to send and receive the various analog and/or digital input and output signals from TCP/IP over a network connection 40.

Network connection couples electronic board rack 28 to an OPC server. By way of example and not limitation, network connection in a preferred embodiment comprises a serial communication to Ethernet. However, it is further contemplated that network connection 40 could comprise any one or more of, for instance, the Internet, an intranet, a LAN (Local Area Network), a WAN (Wide Area Network) or a MAN (Metropolitan Area Network), a frame relay connection, an Advanced Intelligent Network (AIN) connection, a synchronous optical network (SONET) connection, a digital T1, T3 or E1 line, Digital Data Service (DDS) connection, DSL (Digital Subscriber Line) connection, an ATM (Asynchronous Transfer Mode) connection, FDDI (Fiber Distributed Data Interface) or CDDI (Copper Distributed Data Interface) connections.

Tap-changer control system 16 may further generate and alarm 42 when certain criteria are met.

Figure 2:
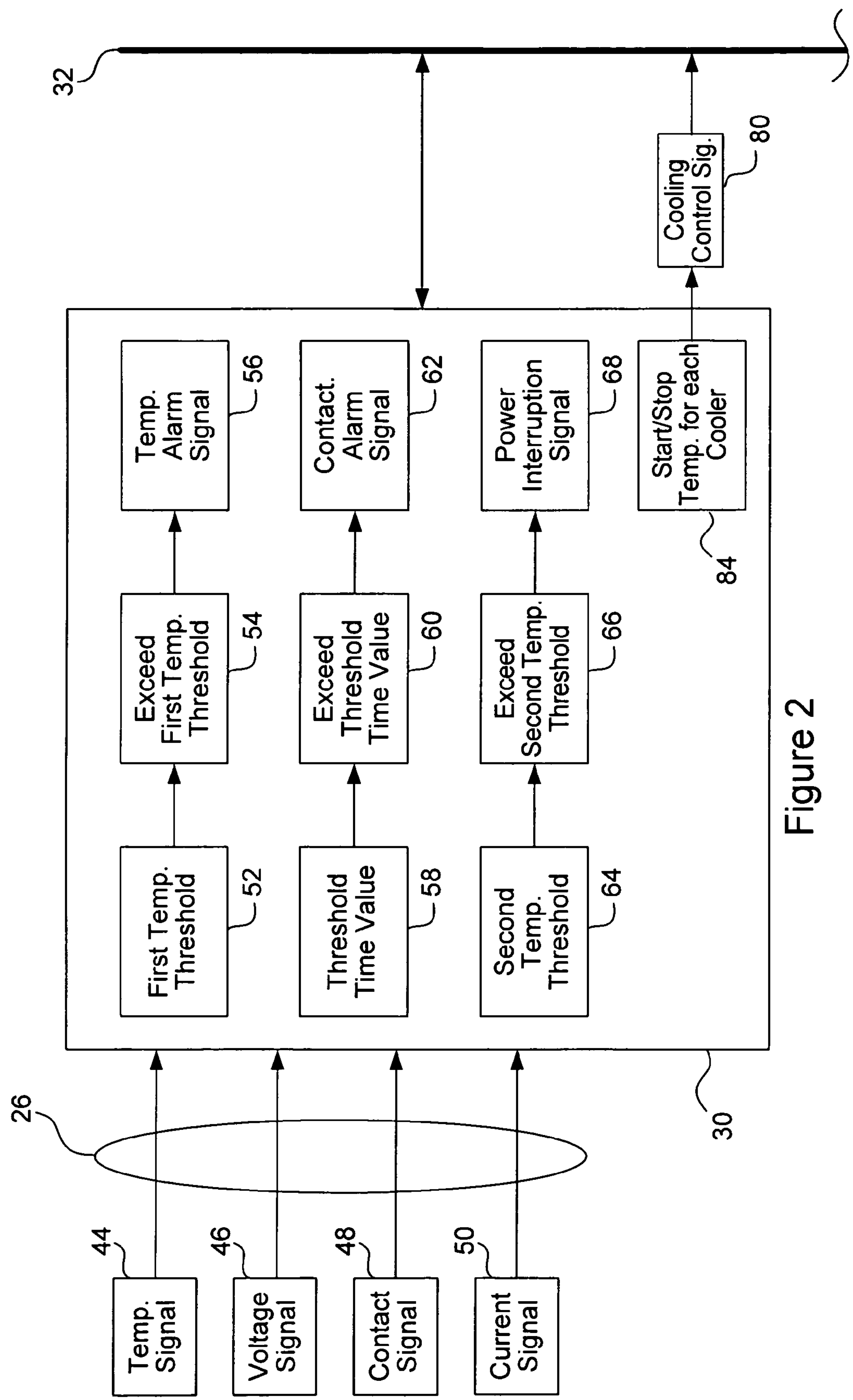
FIG. 2 is a block diagram according to FIG. 1, illustrating another advantageous embodiment of the present invention.

Turning now to FIG. 2, processor board 30 is illustrated in greater detail. In this particular embodiment, temperature signal 44, voltage signal 46, contact signal 48 and current signal 50 are shown coupled 26 to processor board 30. It should be noted that any of the various sensors illustrated in FIG. 1 may be utilized either alone or in any combination. It should further be noted that, while all of the temperature signals are shown coupled 26 to processor board 30, it is contemplated that any or all of the signals may instead be coupled to peripheral boards (34, 34') as desired.

Illustrated on processor board 30 is first threshold temperature 52, which is related to an initial temperature measurement, taken prior to a tap-change maneuver. The temperature is further measured after the tap-change maneuver for a selected time period, (i.e. five minutes) but may comprise any time period desired. The second temperature measurement is compared to the first threshold temperature and if the first threshold is exceeded 54, a temperature alarm signal 56 may be generated.

Also illustrated in FIG. 2 is threshold time value 58, which may comprise a total time value that the contact (not shown) has been closed. The total time value may, in one advantageous embodiment, take into consideration the measured temperature at or near the tap-changer, the time the contact has been closed and the total amount of current passed through the contact. Each of these measurements can affect the total time value. If the threshold time value is exceeded 60, a contact alarm signal 62 may be generated.

Still further illustrated in FIG. 2 is second temperature threshold 64, which is related to the initial temperature measurement taken prior to a tap-change maneuver and further includes compensation for the maneuver(s) to take place. If the temperature measurement taken after the tap-changer maneuver exceeds the second temperature threshold 66, a power interruption signal 68 may be generated in order to interrupt power to the equipment to prevent damage and/or excessive wear thereto.

While these various calculations are illustrated as performed locally by processor board 30, it is contemplated that they may be variously performed by peripheral cards (34, 34') or by tap-changer control system 16 with the variously boards acting to transmit the data to and from transformer (tap-changer and cooling group(s)) 12.

Also illustrated in FIG. 2 is cooling control signal 80, which may include for example, the start/stop temperature for each cooler 82 for control of the various cooling groups. Finally, tap-changer control signal 84 is shown sent via bus 32 to any of the various boards 30, 34, 34'.

Figure 3:
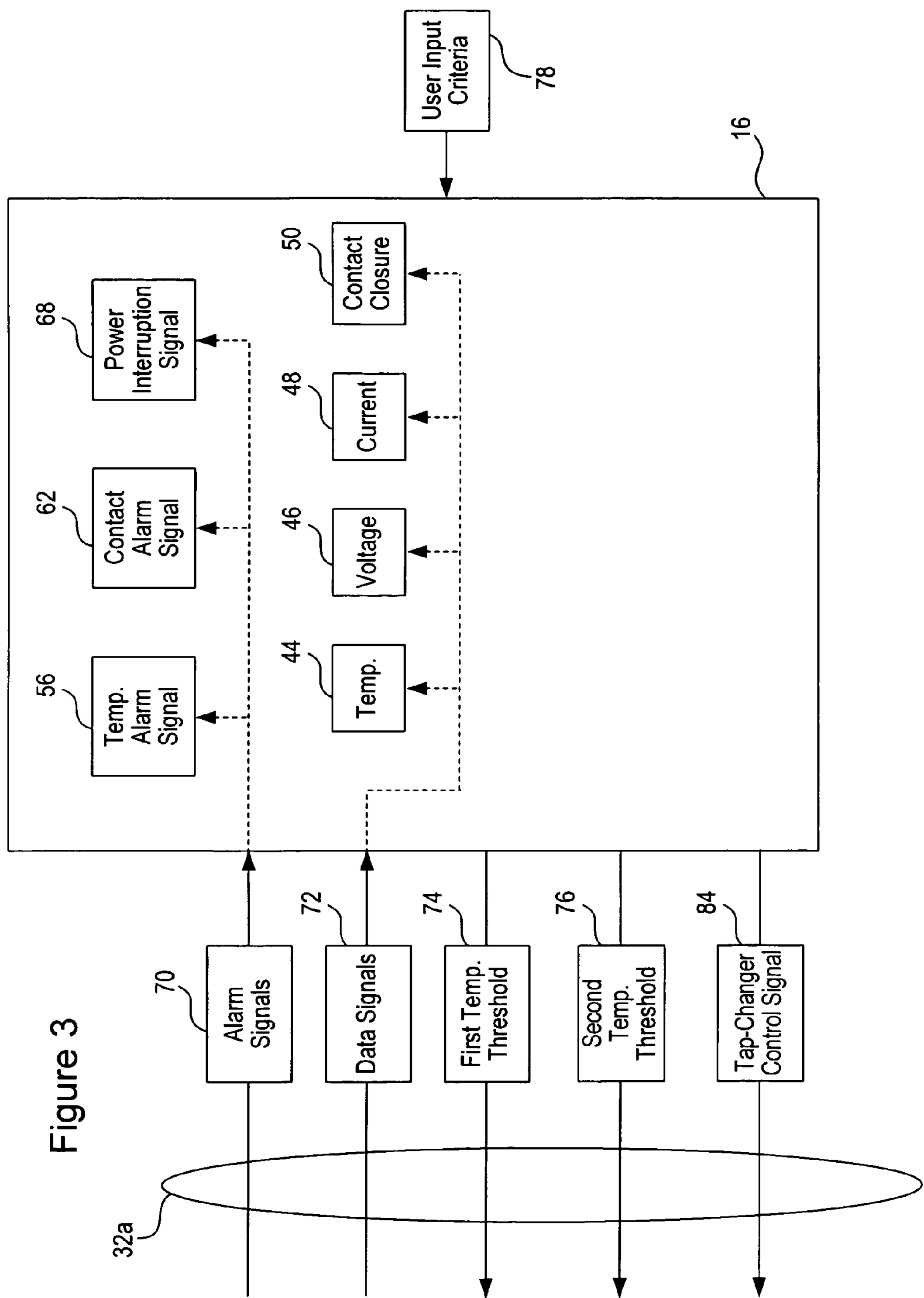
FIG. 3 is a block diagram according to FIG. 1, illustrating still another advantageous embodiment of the present invention.

Referring now to FIG. 3, tap-changer control system 16 is illustrated in greater detail.

For example, alert signals 70 are shown sent via bus 32*a* to tap-changer control system 16 and include, for instance, temperature alarm signal 56, contact alarm signal 62 and power interruption signal 68. Once an alert signal 70 is received, tap-changer control system 16 may then take appropriate action including generation of a particular alarm or interrupting the electrical power to the tap-changer and cooling group (s) 12 and may include a notification of such a shutdown. Please note that while the alarm generation is illustrated as generated in tap-changer control system 16, it is contemplated that it may be accomplished by processor board 30 or other equipment.

Data signals 72 are illustrated as sent to tap-changer control system 16 and may include the various measurement signals 44, 46, 48 & 50 listed in connection with FIG. 2. Also illustrated is first temperature threshold 74 and second temperature threshold 76, which may be either calculated by the system depending upon the initial temperature taken before the tap-change maneuver and the particular maneuver to take place. Alternatively, either or both of these thresholds may be set by user input criteria 78.

In this manner, a versatile control system is provided that may effectively and efficiently be integrated with, for example, existing tap-changer equipment and cooling groups. Typically, the electronic board rack 28 may be retrofit into the tap-changer cabinet 14, eliminating the need to re-wire or install new equipment. In fact, it is contemplated that existing sensor may further be utilized limiting the need to re-wire existing control wiring.

Figure 4B:
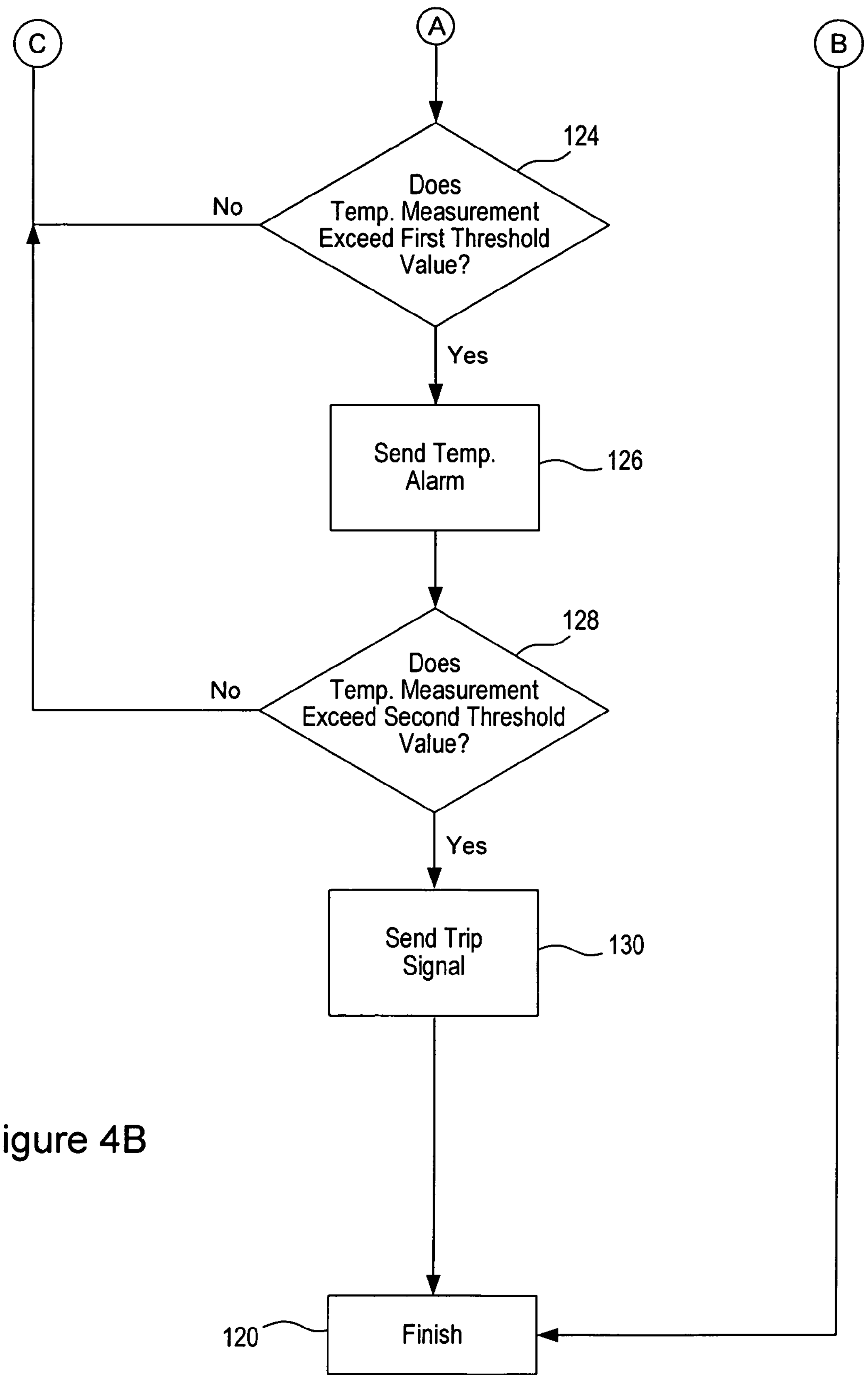
FIG. 4B is a continuation of the flow diagram according to FIG. 4A.

Turning now to FIGS. 4A and 4B, a flow diagram of one advantageous embodiment of universal control system 10 is illustrated. When a signal has been received that a tap-change maneuver shall take place, an initial step of measuring the temperature in the tap-changer 102 is performed. Once this measurement is taken, the measurement may then, in one embodiment, be stored 104 as desired.

It is also contemplated that it may be desired to determine the particular tap-change maneuver to take place 106 so as to calculate a reference temperature 108 related to the particular tap-change maneuver. This reference temperature may then be stored 110.

The system may then proceed to set a first threshold value for an alarm condition to occur based on the initial temperature measurement 112. Still further, the system may then set a second threshold value for an interruption of electrical power based on the reference temperature value 114. Alternatively, it is contemplated that both steps 112 and 114 may be accomplished by direct user input criteria from a user(s).

At this point the particular tap-change may be performed 116. After the tap-change has been accomplished, it is contemplated that it is advantageous to measure the temperature in the vicinity of the tap-changer for a specified time period, such as for example, but not limited to, five minutes after the maneuver is performed.

The next step for the system is to determine if this selected time period has expired 118. If the time period has expired, the system can proceed to finish 120 until another tap-change is to take place. If however the time period has not expired, the system proceeds to measure the temperature in the vicinity of the tap-changer 122.

Once this measurement is obtained, the system may then determine if the measured temperature exceeds the first threshold value 124. If this has not occurred, the system returns to querying whether the time period has expired 118. If the temperature measurement does exceed the first threshold value, the system may generate and send a temperature alarm 126.

After a temperature alarm is generated and sent 126 the system may then determine whether the measured temperature exceeds the second threshold value 128. If not, the system returns to querying whether the time period has expired 118. If however, the second threshold value is exceeded, the system may then proceed to send a trip signal. Optionally, the system may further generate and send a notification of the interruption 132. The system may then finish 120 awaiting reset whether locally or remotely.

Figure 5:
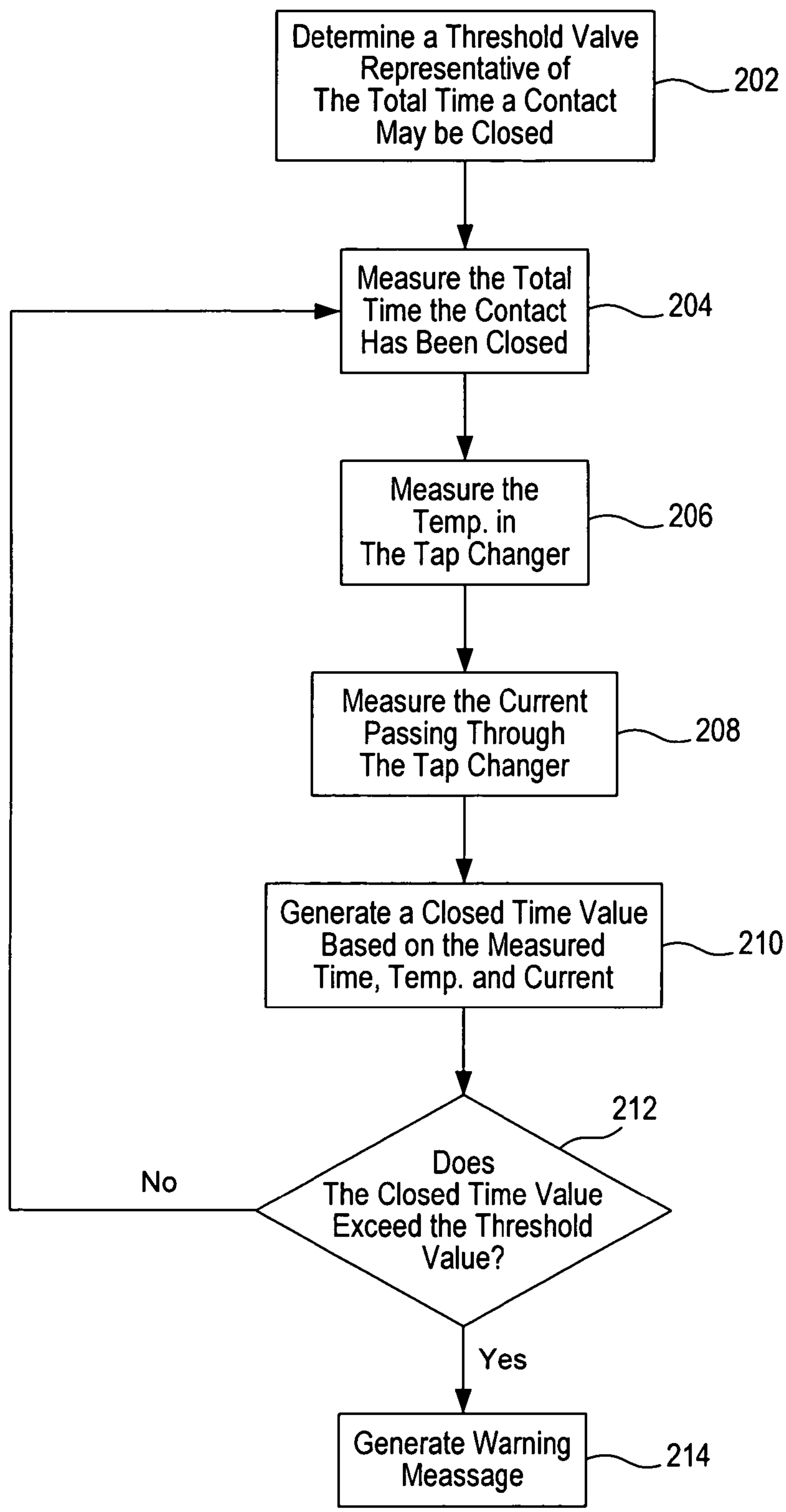
FIG. 5 is a flow diagram of one advantageous embodiment of the present invention according to FIG. 1.

Referring now to FIG. 5, a flow diagram of another process performed by system 10 is illustrated.

Initially, the system determines a threshold value that is representative of the total time a contact may be closed 202. The system may take into consideration temperature measured in the tap-changer and the current passing through the contact.

The system then performs a series of measurements including, for example, measuring the time the contact has been closed 204, measuring the temperature in the tap-changer 206, and measuring the current passing through the tap-changer 208.

Once all of this information has been gathered, the system may then generate a closed time value based on the measured, time, temperature and current 210. The various measure each affect the closed time value. For example, the higher the temperature measurement, the shorter the closed time value will be. Further, the lower the current, the longer the closed time value will be. In this manner, the system can compensate for many factors that can affect carbonization of the contact so as to substantially avoid any carbonization taking place.

The system then determines whether the closed time value exceeds the threshold value 212. If not, the system proceeds to back to measuring the various values including time, temperature and current. If however, the system determines the closed time value does exceed the threshold value, the system may proceed to generate a warning message 214. The warning message may contain a message that the contact needs to be exercised or changed to avoid carbonization.

It should be noted that, while various functions and methods have been described and presented in a sequence of steps, the sequence has been provided merely as an illustration of advantageous embodiments, and that it is not necessary to perform these functions in the specific order illustrated. It is further contemplated that any of these steps may be moved and/or combined relative to any of the other steps. In addition, it is still further contemplated that it may be advantageous, depending upon the application, to utilize all or any portion of the functions described herein.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A diagnostic system for protecting a tap-changer comprising:

a sensor, positioned to detect temperature changes;

an initial measured temperature, indicating an initial temperature measured by said sensor prior to initiating a tap change;

a calculated temperature value, calculated according to the particular tap change to take place;

a threshold value determined based on said initial measured temperature and said calculated temperature value, at which an alarm is generated;

a second measured temperature indicating an actual temperature measured by said sensor after a tap change has been initiated;

said alarm generated by the diagnostic system if said second measured temperature exceeds said threshold value.

2. The diagnostic system according to claim 1, further comprising a second threshold value above which, flow of electrical power through said tap-changer will be interrupted.

3. The diagnostic system according to claim 2, in which said second threshold value is higher than said first threshold value.

4. A diagnostic system for preventing degradation to electrical contacts in a tap-changer comprising:

a contact measurement device for measuring a contact position;

a contact signal generated by said contact measurement device, indicative of whether the contact is open or closed;

a threshold time value related to a maximum amount of time that the contact may be in the contact position;

a controller for receiving the contact signal and generating a closed time value based on the contact signal;

said controller comparing the closed time value to said threshold time value to determine if the closed time value exceeds said threshold time value;

a warning message generated by the diagnostic system indicating that said threshold time value has been exceeded.

5. The diagnostic system according to claim 4, further comprising a temperature sensor located in the vicinity of the contact to measure temperature and generate a temperature signal, said controller receiving the temperature signal and determining whether the warning message should be generated based on both the threshold time value and the temperature signal.

6. The diagnostic system according to claim 5, wherein the higher the temperature signal, the shorter the threshold time value must be for the system to generate the warning message.

7. The diagnostic system according to claim 4, further comprising a current sensor to measure current through the contact and generate a current signal, said controller receiving the current signal and determining whether the warning message should be generated based on both the threshold time value and the current signal.

8. The system according to claim 7, wherein the higher the current signal, the shorter the threshold time value must be for the system to generate the warning message.

9. The diagnostic system according to claim 4, further comprising:

a temperature sensor located in the vicinity of the contact to measure temperature and generate a temperature signal;

a current sensor to measure current through the contact and generate a current signal;

said controller receiving the temperature signal and the current signal and determining whether the warning message should be generated based on, the threshold time value, the temperature signal, and the current signal.

10. The system according to claim 9, wherein the higher the temperature signal and/or the higher the current signal, the shorter the threshold time value must be for the system to generate the warning message.

* * * * *